(12) United States Patent
Lee et al.

(10) Patent No.: US 10,453,821 B2
(45) Date of Patent: Oct. 22, 2019

(54) CONNECTION SYSTEM OF SEMICONDUCTOR PACKAGES

(71) Applicant: SAMSUNG ELECTRONICS CO., LTD., Suwon-si (KR)

(72) Inventors: Yun Tae Lee, Suwon-Si (KR); Han Kim, Suwon-Si (KR); Hyung Joon Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/966,673

(22) Filed: Apr. 30, 2018

(65) Prior Publication Data

US 2019/0043835 A1 Feb. 7, 2019

(30) Foreign Application Priority Data

Aug. 4, 2017 (KR) .................. 10-2017-0099219
Sep. 27, 2017 (KR) .................. 10-2017-0125377

(51) Int. Cl.
*H01L 25/065* (2006.01)
*H01L 25/00* (2006.01)
(Continued)

(52) U.S. Cl.
CPC ...... *H01L 25/0657* (2013.01); *H01L 23/5384* (2013.01); *H01L 23/5389* (2013.01);
(Continued)

(58) Field of Classification Search
CPC . H01L 25/50; H01L 25/0657; H01L 23/5384; H01L 24/95; H01L 2924/15311; H01L 2225/107; H01L 2225/1058
See application file for complete search history.

(56) References Cited

U.S. PATENT DOCUMENTS

2012/0267777 A1    10/2012  Haba et al.
2014/0340849 A1*   11/2014  Kim .................. H01L 23/34
                                            361/717
(Continued)

FOREIGN PATENT DOCUMENTS

CN      104661431 A      5/2015
JP      2014-512691 A    5/2014
(Continued)

OTHER PUBLICATIONS

Office Action issued in corresponding Korean Patent Application No. 10-2017-0125377, dated Jun. 21, 2018.
(Continued)

*Primary Examiner* — Yosef Gebreyesus
(74) *Attorney, Agent, or Firm* — Sughrue Mion, PLLC

(57) ABSTRACT

A connection system of semiconductor packages includes: a printed circuit board having a first surface, and a second surface, opposing the first surface; a first semiconductor package disposed on the first surface of the printed circuit board and connected to the printed circuit board through first electrical connection structures; and a second semiconductor package disposed on the second surface of the printed circuit board and connected to the printed circuit board through second electrical connection structures. The first semiconductor package includes an application processor (AP) and a power management integrated circuit (PMIC) disposed side by side, and the second semiconductor package includes a memory.

25 Claims, 14 Drawing Sheets

(51) Int. Cl.
*H01L 23/538* (2006.01)
*H01L 23/00* (2006.01)
*H01L 25/10* (2006.01)

(52) U.S. Cl.
CPC ............. *H01L 24/19* (2013.01); *H01L 24/20* (2013.01); *H01L 24/95* (2013.01); *H01L 25/105* (2013.01); *H01L 25/50* (2013.01); *H01L 2224/04105* (2013.01); *H01L 2224/12105* (2013.01); *H01L 2224/16227* (2013.01); *H01L 2224/24137* (2013.01); *H01L 2224/24145* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2225/107* (2013.01); *H01L 2225/1035* (2013.01); *H01L 2225/1058* (2013.01); *H01L 2924/15311* (2013.01); *H01L 2924/18162* (2013.01)

(56) References Cited

U.S. PATENT DOCUMENTS

| | | | |
|---|---|---|---|
| 2015/0075186 A1* | 3/2015 | Prajapati | G06F 1/20 62/3.7 |
| 2015/0262909 A1 | 9/2015 | Chen | |
| 2015/0342051 A1 | 11/2015 | Yu | |
| 2016/0093588 A1* | 3/2016 | Wang | B23H 7/10 |
| 2016/0099192 A1 | 4/2016 | Chen et al. | |
| 2016/0113115 A1* | 4/2016 | Kwon | H05K 1/181 361/679.26 |
| 2016/0133614 A1 | 5/2016 | Gu et al. | |
| 2016/0161992 A1* | 6/2016 | Kwon | H01L 23/48 361/679.31 |
| 2016/0276284 A1 | 9/2016 | Chen et al. | |
| 2016/0307870 A1 | 10/2016 | Kelly et al. | |
| 2016/0329298 A1 | 11/2016 | Lee et al. | |
| 2016/0338202 A1 | 11/2016 | Park et al. | |
| 2017/0170124 A1 | 6/2017 | Huang et al. | |
| 2017/0185107 A1 | 6/2017 | Kwon | |

FOREIGN PATENT DOCUMENTS

| | | |
|---|---|---|
| JP | 2016-213466 A | 12/2016 |
| KR | 10-1362714 B1 | 2/2014 |
| KR | 10-2015-0106815 A | 9/2015 |
| KR | 10-2015-0134696 A | 12/2015 |
| KR | 10-2016-0046521 A | 4/2016 |
| KR | 10-2016-0111308 A | 9/2016 |
| KR | 10-2016-0131170 A | 11/2016 |
| KR | 10-2017-0043427 A | 4/2017 |

OTHER PUBLICATIONS

Communication dated Aug. 6, 2019, issued by the Japanese Patent Office in counterpart Japanese Application No. 2018-090297.

* cited by examiner

CONNECTION SYSTEM OF SEMICONDUCTOR PACKAGES

CROSS-REFERENCE TO RELATED APPLICATION(S)

This application claims benefit of priority to Korean Patent Application Nos. 10-2017-0099219 filed on Aug. 4, 2017 and 10-2017-0125377 filed on Sep. 27, 2017 in the Korean Intellectual Property Office, the disclosure of which is incorporated herein by reference in its entirety.

TECHNICAL FIELD

The present disclosure relates to a connection system of semiconductor packages, and more particularly, to a system in which a plurality of semiconductor packages are connected to each other using a printed circuit board.

BACKGROUND

Recently, in accordance with the development of smart devices, specifications of the respective components thereof have increased. Particularly, specifications of an application processor (AP), a core integrated circuit (IC) of a smart device, have been rapidly developed. In order to satisfy such high specifications, an AP package and a memory package have recently been used in a package-on-package (POP) manner.

Meanwhile, recently, a size of the AP package has been decreased, and the number of inputs/outputs (I/Os) of a memory has increased. Therefore, all balls connected to a memory package may not only be disposed in a fan-out region of the AP package. Therefore, an interposer may be disposed between the memory package and the AP package to connect the memory package and the AP package to each other or a separate backside redistribution layer may be formed on a top surface of the AP package to connect the AP package to the memory package.

In addition, a power management IC (PMIC) is disposed on a printed circuit board, separately from the AP package and the memory package as described above, to manage power.

SUMMARY

An aspect of the present disclosure may provide a connection system of semiconductor packages in which an application processor (AP) and a memory may be connected to each other by a short path without using a separate interposer or backside redistribution layer and a power management IC (PMIC) may be disposed at an optimal design.

According to an aspect of the present disclosure, a connection system of semiconductor packages may be provided, in which one package in which an application process (AP) and a power management integrated circuit (PMIC) are disposed side by side is mounted on one surface of a printed circuit board and a memory package is mounted on the other surface of the printed circuit board.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
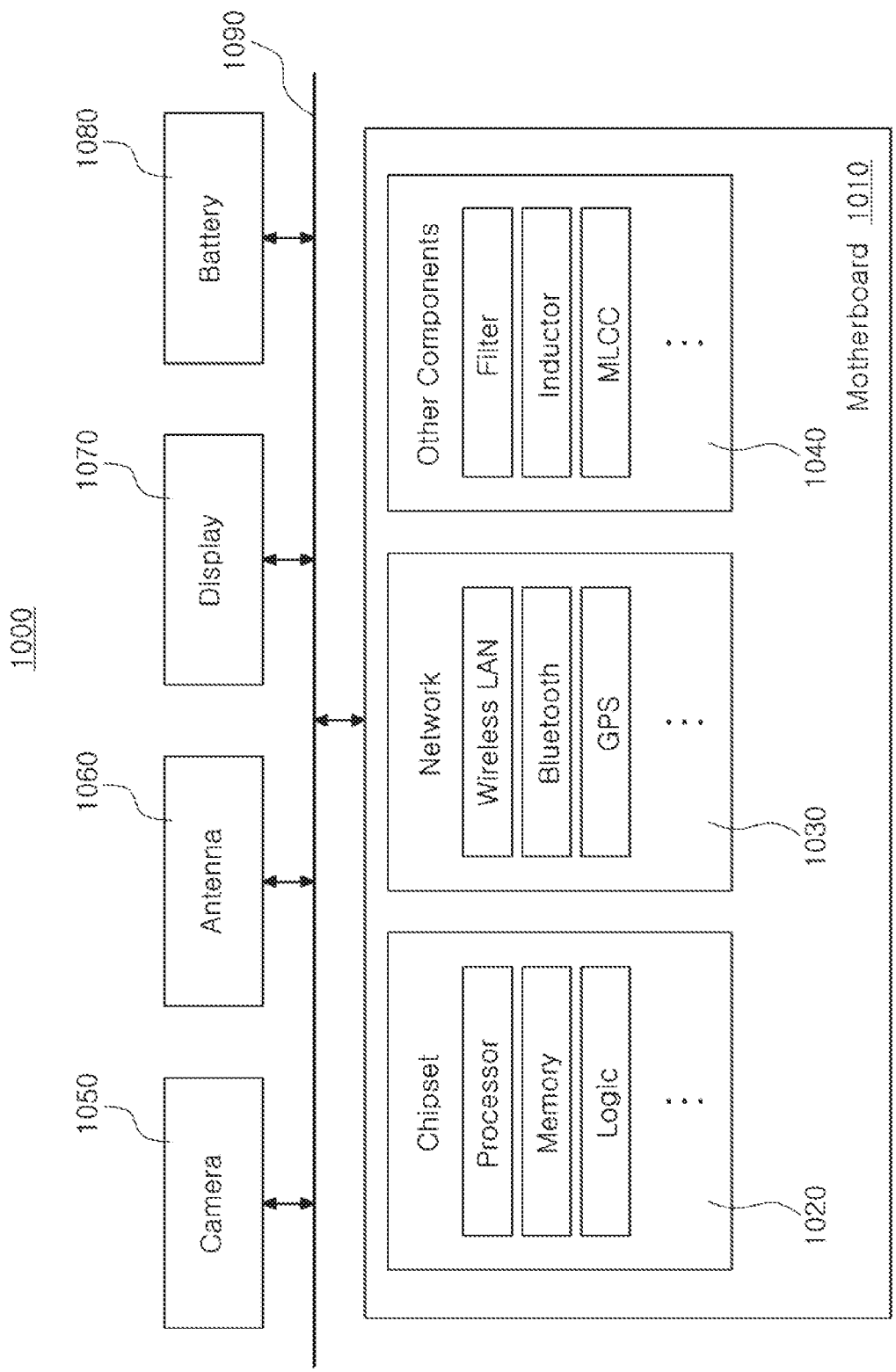
FIG. 1 is a schematic block diagram illustrating an example of an electronic device system.

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
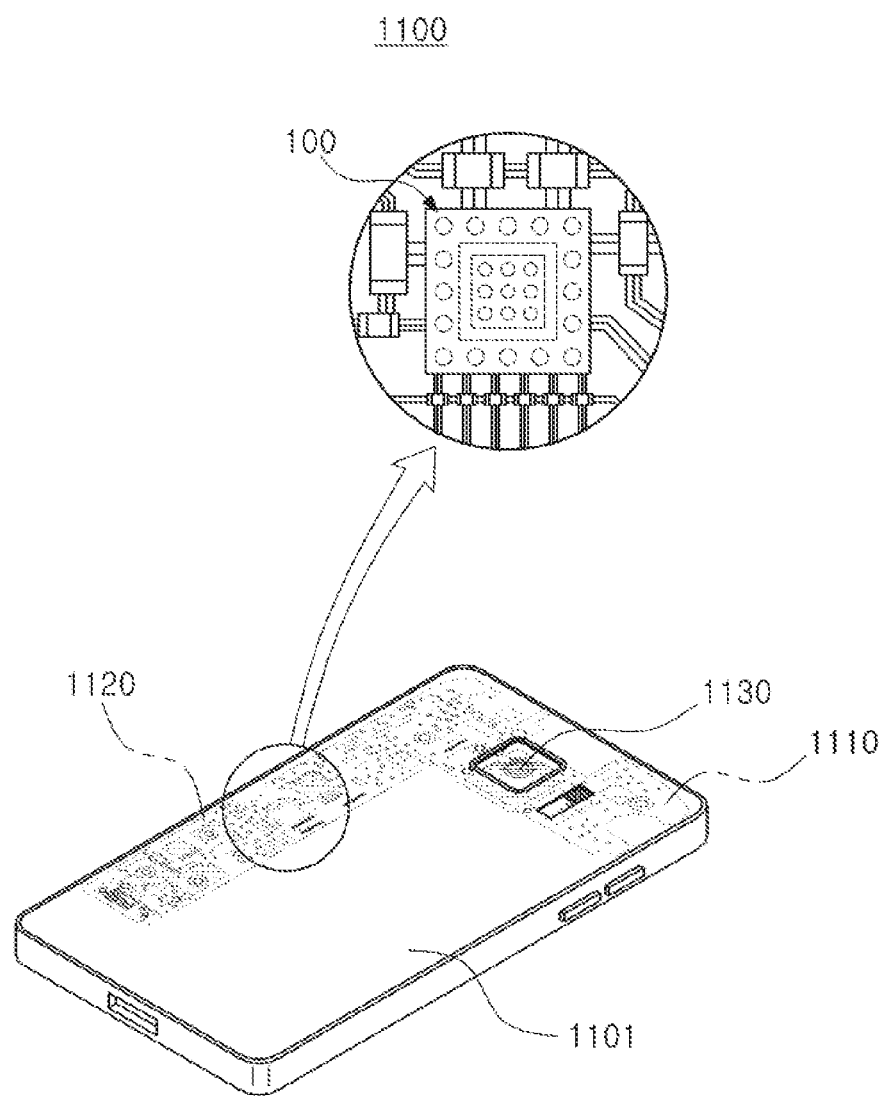
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
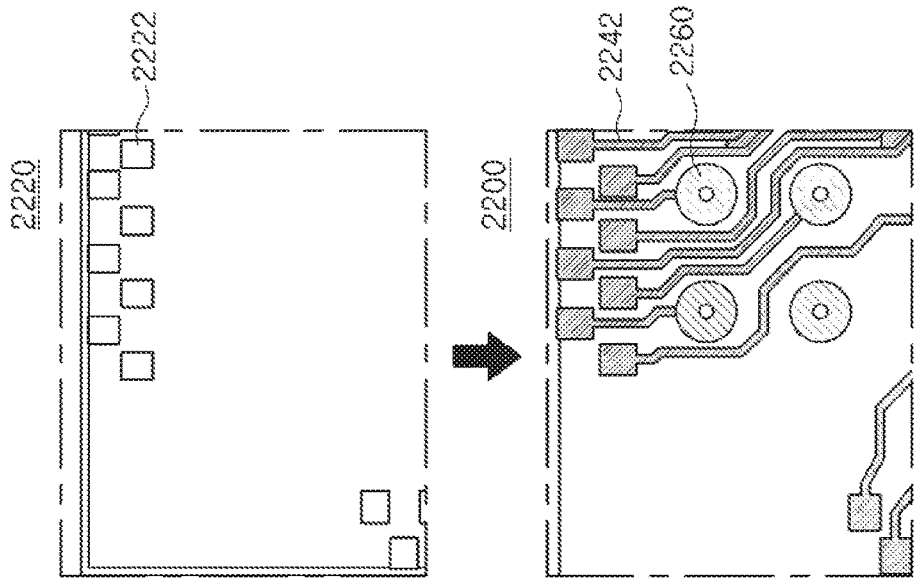
FIGS. 3A and 3B are schematic cross-sectional views illustrating states of a fan-in semiconductor package before and after being packaged.
Figure 3A:
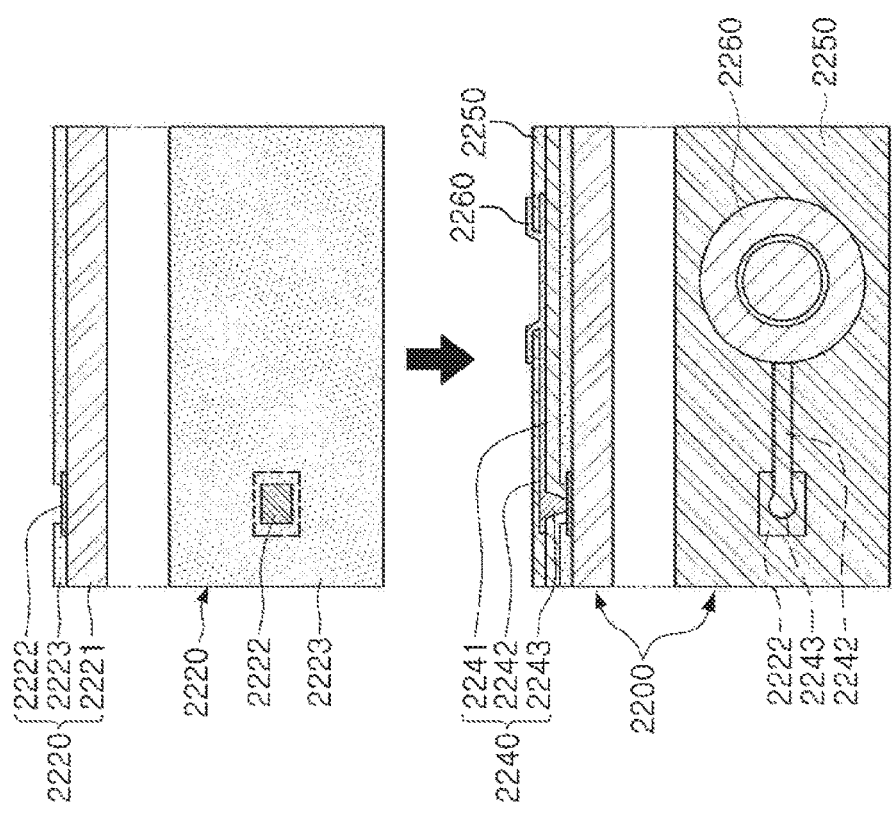

FIGS. 3A and 3B are schematic cross-sectional views illustrating states of a fan-in semiconductor package before and after being packaged.

Figure 4:
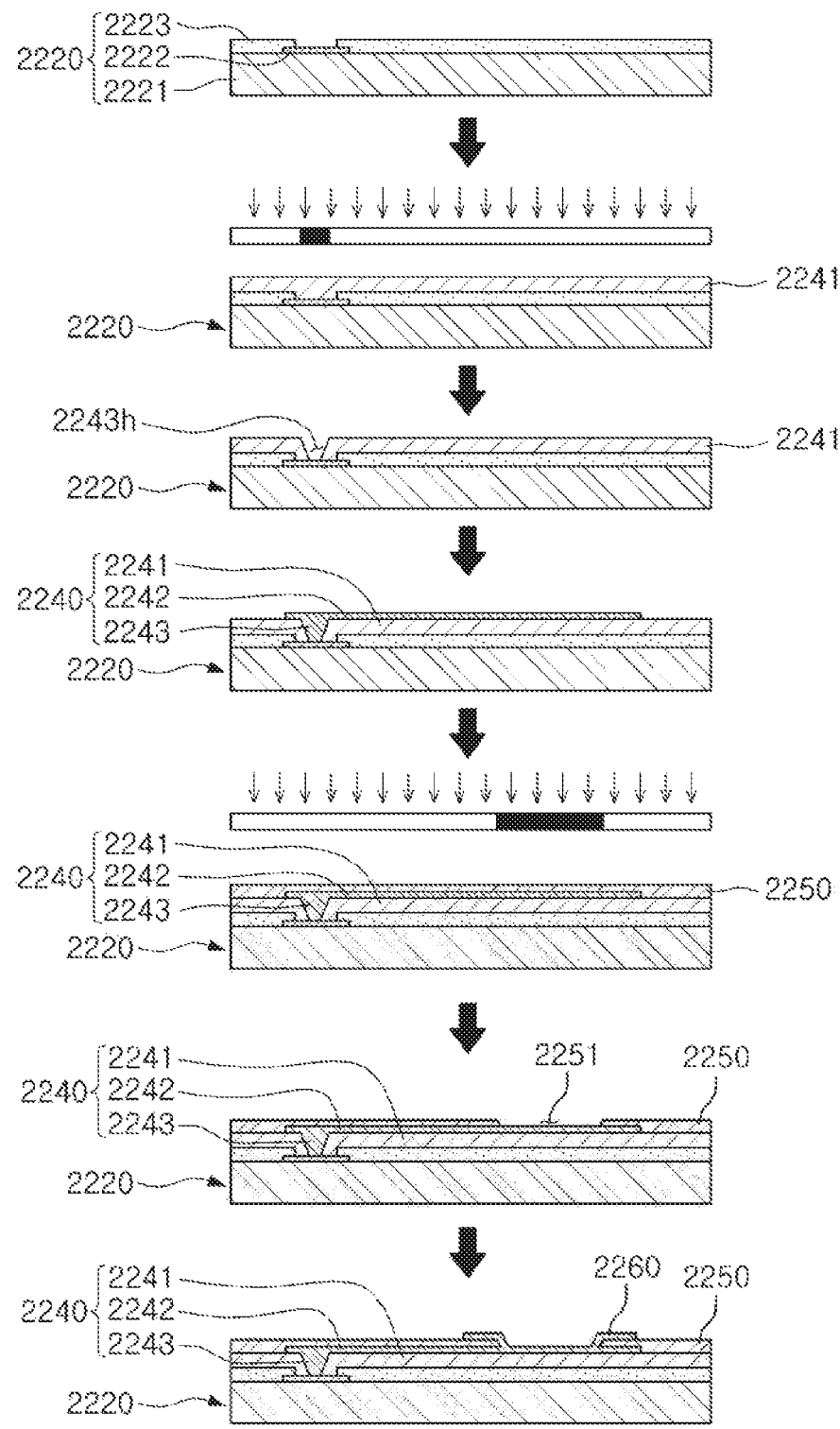
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
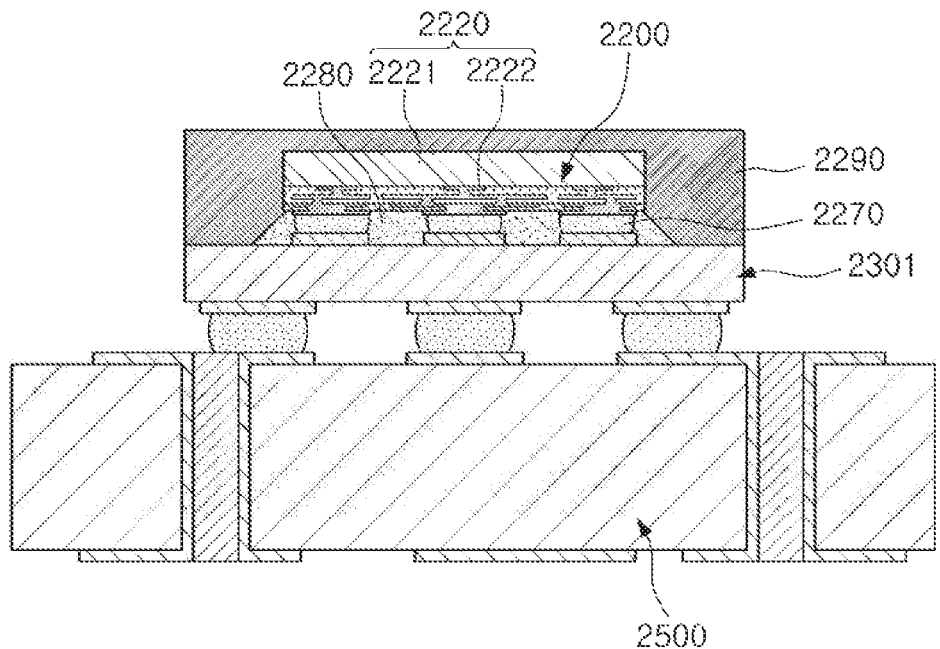
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
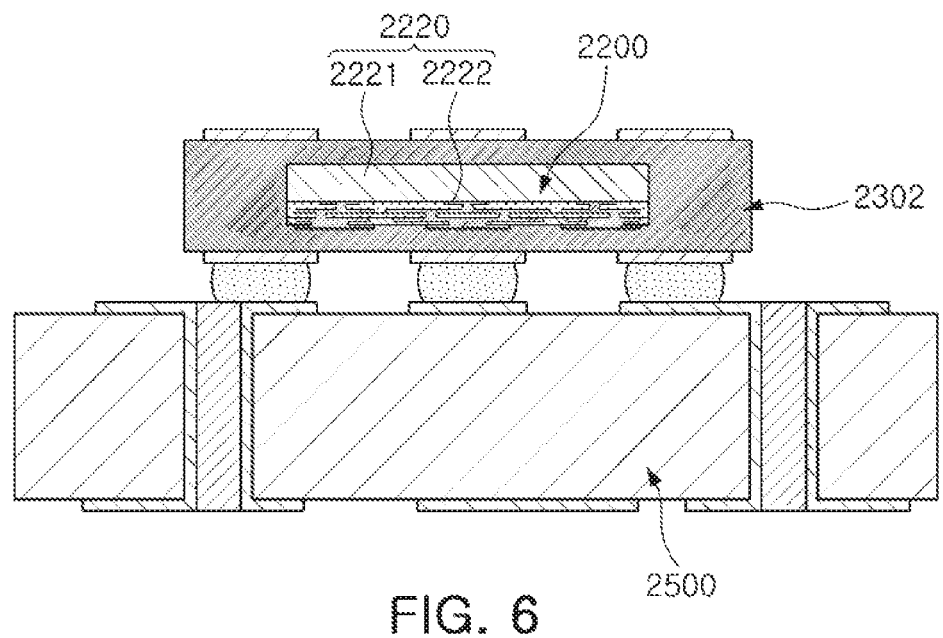
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-out Semiconductor Package

Figure 7:
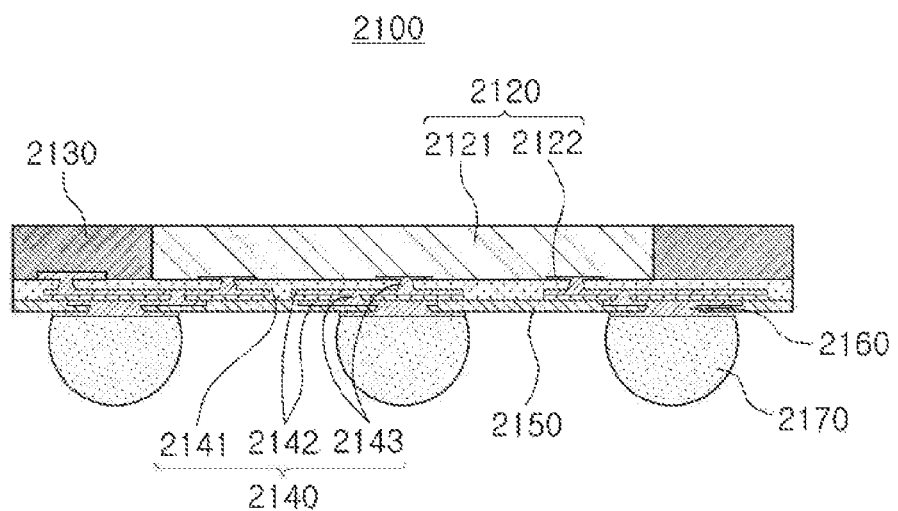
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
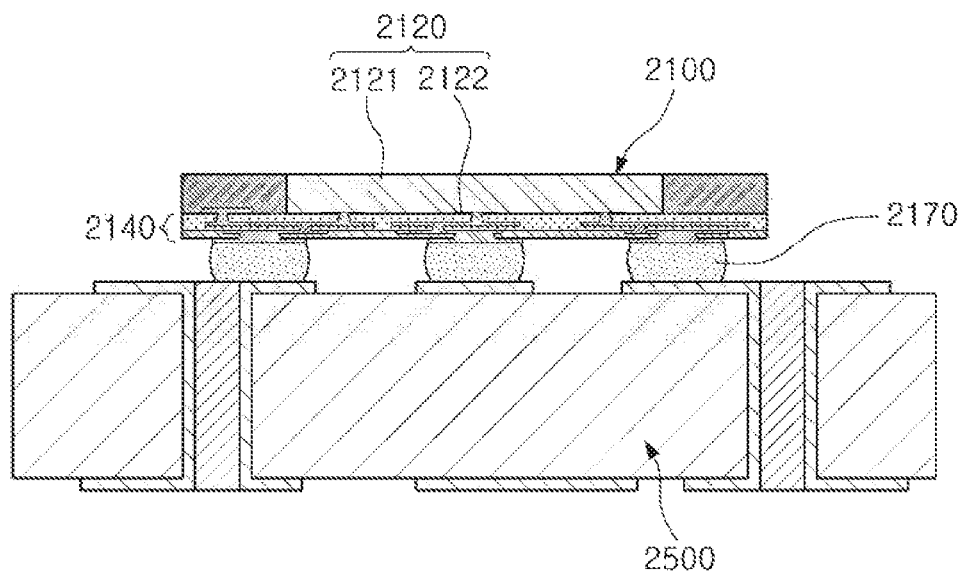
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem occurring due to a warpage phenomenon.

Meanwhile, the fan-out semiconductor package refers to a package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Connection System of Semiconductor Package

Figure 9:
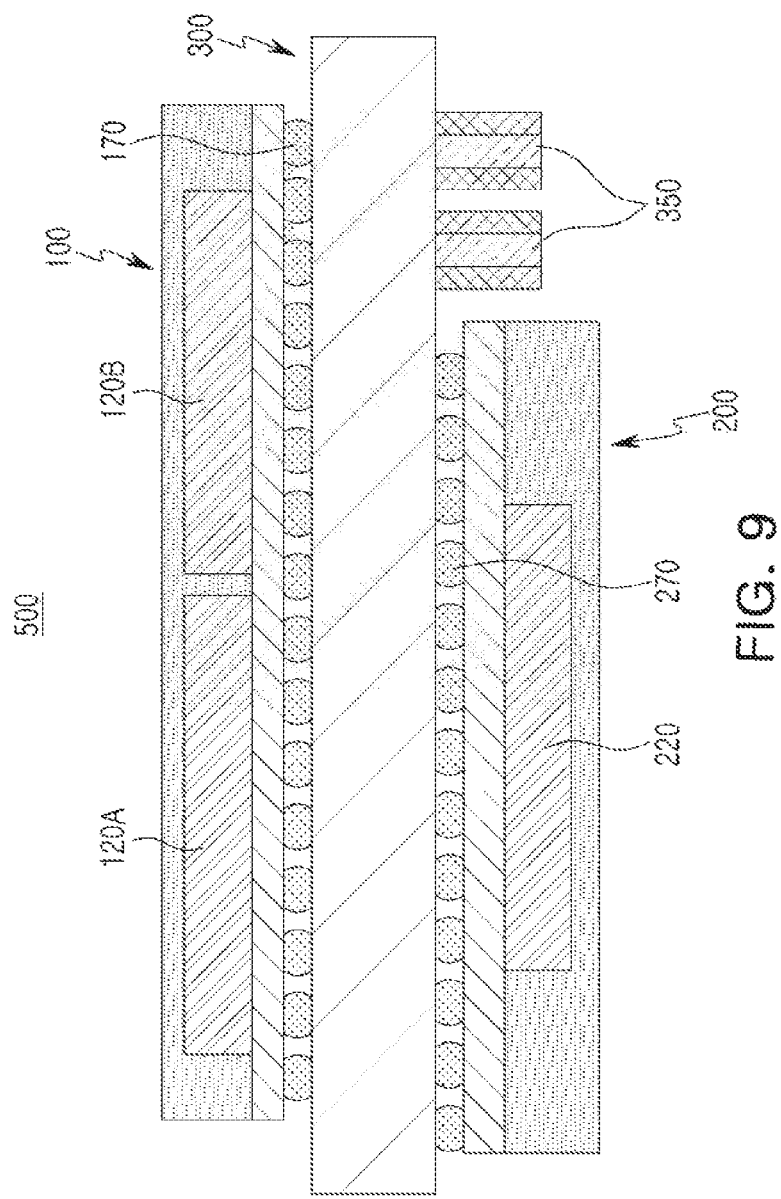
FIG. 9 is a schematic cross-sectional view illustrating a connection system of semiconductor packages according to an exemplary embodiment in the present disclosure.

FIG. 9 is a schematic cross-sectional view illustrating a connection system of semiconductor packages according to an exemplary embodiment in the present disclosure.

Referring to the drawings, a connection system 500 of semiconductor packages according to an exemplary embodiment in the present disclosure may include a printed circuit board 300, a first semiconductor package 100 disposed on a first surface of the printed circuit board 300, a second semiconductor package 200 disposed on a second surface of the printed circuit board 300, and passive components 350 disposed on the second surface of the printed circuit board 300. The first semiconductor package 100 may include an application processor (AP) 120A and a power management integrated circuit (PMIC) 120B. The AP 120A and the PMIC 120B may be disposed side by side in the first semiconductor package 100. The second semiconductor package 200 may include a memory 220. The first semiconductor package 100 may be electrically connected to the printed circuit board 300 through electrical connection structures 170. The second semiconductor package 200 may be electrically connected to the printed circuit board 300 through electrical connection structures 270.

The AP 120A and the PMIC 120B of the first semiconductor package 100 may be electrically connected to each other through redistribution layers in the first semiconductor package 100. For example, output power of the PMIC 120B may be transferred to a power input/output (I/O) of the AP 120A through the redistribution layers. The second semiconductor package 200 including the memory may be disposed on the second surface of the printed circuit board 300 opposing the first surface of the printed circuit board 300 on which the first semiconductor package 100 is disposed, and may be electrically connected to the first semiconductor package 100 through circuits and vias of the printed circuit board 300 to transmit and receive signals to and from the AP 120A. That is, the first semiconductor package 100 and the second semiconductor package 200 may be disposed to face each other with the printed circuit board 300 interposed therebetween. In this case, the AP 120A and the memory 220 may be disposed to face each other with the printed circuit board 300 interposed therebetween. The output power of the PMIC 120B may also be connected to the memory 220 through the printed circuit board 300. The first semiconductor package 100 and/or the second semiconductor package 200 may also be electrically connected to the passive components 350 through the printed circuit board 300.

In the connection system 500 of semiconductor packages having such a structure, the memory 200 generally has a large number of I/Os, but the second semiconductor package 200 including the memory 220 is connected to the first semiconductor package 100 through the printed circuit board 300, and the connection system 500 of semiconductor packages may thus not be affected by the number of I/Os of the memory 220. In addition, a separate POP structure does not need to be used, and a backside redistribution layer or an interposer substrate is also not required. Therefore, the connection system 500 of semiconductor packages may be thinned, and signal paths of the connection system 500 of semiconductor packages may also be simplified. In addition, since the AP 120A and the PMIC 120B are disposed side by side in one package 100, power paths may also be significantly reduced, and since the AP 120A and the PMIC 120B generating a large amount of heat are disposed in one package 100, heat of the AP 120A and heat of the PMIC 120B may be simultaneously dissipated effectively through a design of a heat dissipation member, or the like, disposed on the package 100.

Meanwhile, the first semiconductor package 100 may be designed in a panel level package (PLP) manner, a wafer level package (WLP) manner, or the like, as described below, and the second semiconductor package 200 may be designed in a chip scale package (CSP) manner, a WLP manner, a PLP manner, or the like.

In addition, the passive components 350 may be multi-layer ceramic capacitors (MLCCs), low inductance chip capacitors (LICCs), inductors, beads, or various known filters, or the like, respectively. The number of passive components 350 is not particularly limited, but may be more than that illustrated in the drawing or may be less than that illustrated in the drawing.

In addition, the printed circuit board 300 may be the main board of the electronic device, and may be a sub-board in some cases. The printed circuit board 300 may include a plurality of build-up layers, a plurality of circuit layers, and vias of a plurality of layers for an electrical connection, and the vias of a plurality of layers may be a stack-type via in order to significantly reduce an electrical path of the first semiconductor package 100 and the second semiconductor package 200, but are not limited thereto. In some cases, a core substrate may be disposed in the printed circuit board. Other components, modules, packages, and the like, may further be mounted, in addition to the abovementioned components, on the printed circuit board 300. The printed circuit board 300 may have a thickness greater than a thickness of a connection member to be described below with reference to FIGS. 10A through 10D and a thickness of another connection member to be described below with reference to FIGS. 11A through 11F.

FIGS. 10A through 10D are schematic cross-sectional views illustrating various examples of a first semiconductor package of the connection system of semiconductor packages of FIG. 9.

Figure 10A:
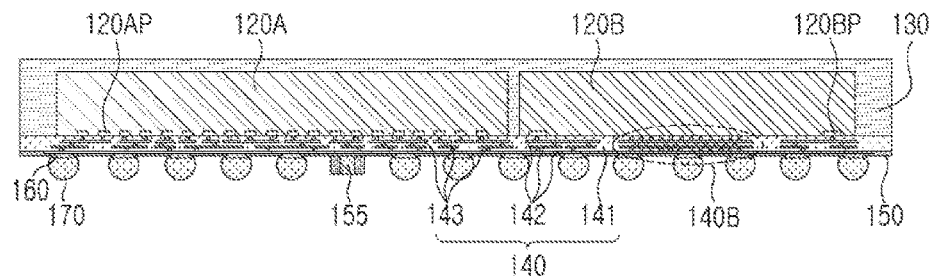
FIGS. 10A through 10D are schematic cross-sectional views illustrating various examples of a first semiconductor package of the connection system of semiconductor packages of FIG. 9.

Referring to FIG. 10A, a first semiconductor package 100A may include an AP 120A having an active surface having connection pads 120AP disposed thereon and an inactive surface opposing the active surface, a PMIC 120B having an active surface having connection pads 120BP disposed thereon and an inactive surface opposing the active surface, an encapsulant 130 encapsulating at least portions of each of the AP 120A and the PMIC 120B, a connection member 140 disposed on the active surface of the AP 120A and the active surface of the PMIC 120B and including insulating layers 141 and redistribution layers 142 and vias 143 disposed on and in the insulating layers 141, a passivation layer 150 disposed on the connection member 140, an underbump metal layer 160 disposed in openings of the passivation layer 150 and electrically connected to the redistribution layer 142 of the connection member 140, and electrical connection structures 170 electrically connected to the redistribution layer 142 of the connection member 140 through the underbump metal layer 160. Passive components 155 such as capacitors, inductors, or the like, may further be disposed on the passivation layer 150, if necessary.

Each of the AP 120A and the PMIC 120B may be an integrated circuit (IC) provided in an amount of several hundreds to several million or more elements integrated in a single chip. In this case, a base material of a body of each of the AP 120A and the PMIC 120B may be silicon (Si), germanium (Ge), gallium arsenide (GaAs), or the like. Various circuits may be formed on the body. The respective connection pads 120AP and 120BP may electrically connect the AP 120A and the PMIC 120B to other components. A material of each of the connection pads 120AP and 120BP may be a conductive material such as aluminum (Al), or the like. A passivation layer exposing the connection pads 120AP and 120BP may be formed on each of the bodies, and may be an oxide film, a nitride film, or the like, or a double layer of an oxide layer and a nitride layer. An insulating layer, or the like, may further be disposed on each of other required positions, and an insulating layer and a redistribution layer may also be formed, if necessary.

The encapsulant 130 may protect the AP 120A and the PMIC 120B. An encapsulation form of the encapsulant 130 is not particularly limited, and may be a form in which the encapsulant 130 surrounds at least portions of the AP 120A and the PMIC 120B. For example, the encapsulant 130 may cover the inactive surfaces and side surfaces of the AP 120A and the PMIC 120B, and cover at least portions of the active surfaces of the AP 120A and the PMIC 120B. The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as an Ajinomoto Build up Film (ABF), FR-4, Bismaleimide Triazine (BT), or the like. In addition, a known molding material such as an epoxy molding compound (EMC), or the like, may also be used. Alternatively, a PID resin on which a photolithography process may be performed may also be used as the insulating material. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material, in order to control warpage or maintain rigidity.

The connection member 140 may redistribute the connection pads 120AP of the AP 120A and the connection pads 120BP of the PMIC 120B. In addition, the connection member 140 may electrically connect the connection pads 120AP and 120BP to each other. Several tens to several hundreds of connection pads 120AP and 120BP having various functions may be redistributed by the connection member 140, and may be physically or electrically externally connected through the electrical connection structures 170 depending on the functions. The connection member 140 may include the insulating layers 141, the redistribution layers 142 disposed on the insulating layers 141, and the vias 143 penetrating through the insulating layers 141 and connected to the redistribution layers 142. The connection member 140 may be formed of a single layer, or may be formed of a plurality of layers of which the number is greater than that illustrated in the drawing.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 have multiple layers, materials of the insulating layers 141 may be the same as each other, and may also be different from each other, if necessary. When the insulating layers 141 are the multiple layers, the insulating layers 141 may be integrated with each other depending on a process, such that boundaries therebetween may also not be apparent.

The redistribution layers 142 may serve to substantially redistribute the connection pads 120AP and 120BP, and may electrically connect the connection pads 120AP and 120BP to each other. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 142 may include via pads, electrical connection structures pads, and the like.

The vias 143 may electrically connect the redistribution layers 142, the connection pads 120AP and 120BP, or the like, formed on different layers, resulting in an electrical path in the first semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

A heat dissipation member 140B may be formed on a region of the connection member 140 connected to the active surface of the PMIC 120B, if necessary. The heat dissipation member 140B may include heat dissipation vias of a plurality of layers densely formed at a very short distance, but is not limited thereto, and may include metal blocks, or the like, instead of the heat dissipation vias. The plurality of layers and the heat dissipation vias thereof or the metal blocks of the heat dissipation member 140B may have a thermal conductivity greater than that of the insulating layers 141, and may be formed of the same material used to form the redistribution layers 142 and the vias 143, or formed of any other suitable metals or metal alloys. In a case in which the plurality of layers and the heat dissipation vias thereof or the metal blocks of the heat dissipation member 140B are formed of the same material used to form the redistribution layers 142 and the vias 143, a volume and/or a density of such a material contained in the heat dissipation member 140B may be greater than any other continuous portion in the connection member 140 having the same size as the heat dissipation member 140B. The plurality of layers and the heat dissipation vias thereof or the metal blocks of the heat dissipation member 140B may not be used to transmit electrical power to the AP 120A and the memory 220. The plurality of layers and the heat dissipation vias thereof or the metal blocks of the heat dissipation member 140B may be electrically floating or electrically connected to the ground (GND) patterns. When the heat dissipation member 140B is formed, heat of the PMIC 120B generating a large amount of heat may be effectively transferred to the printed circuit board 300, and the first semiconductor package 100A may thus have an excellent heat dissipation effect.

The passivation layer 150 may protect the connection member 140 from external physical or chemical damage. The passivation layer 150 may have the openings exposing at least portions of the redistribution layer 142 of the connection member 140. The number of openings formed in the passivation layer 150 may be several tens to several thousands. The passivation layer 150 may include an insulating resin and an inorganic filler, but may not include a glass fiber. For example, the passivation layer 150 may be formed of ABF, but is not limited thereto.

The underbump metal layer 160 may improve connection reliability of the electrical connection structures 170 to improve board level reliability of the first semiconductor package 100A. The underbump metal layer 160 may be connected to the redistribution layer 142 of the connection member 100 exposed through the openings of the passivation layer 150. The underbump metal layer 160 may be formed in the openings of the passivation layer 150 by a known metallization method using a known conductive material such as a metal, but is not limited thereto.

The electrical connection structures 170 may be additionally configured to physically or electrically externally connect the first semiconductor package 100A. For example, the first semiconductor package 100A may be mounted on the printed circuit board 300 through the electrical connection structures 170. Each of the electrical connection structures 170 may be formed of a conductive material, for example, a solder, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120AP and 120BP, or may be provided in an amount of several tens to several thousands or more or several tens to several thousands or less.

At least one of the electrical connection structures 170 may be disposed in a fan-out region. The fan-out region is a region except for the region in which the AP 120A and the PMIC 120B are disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 10B:
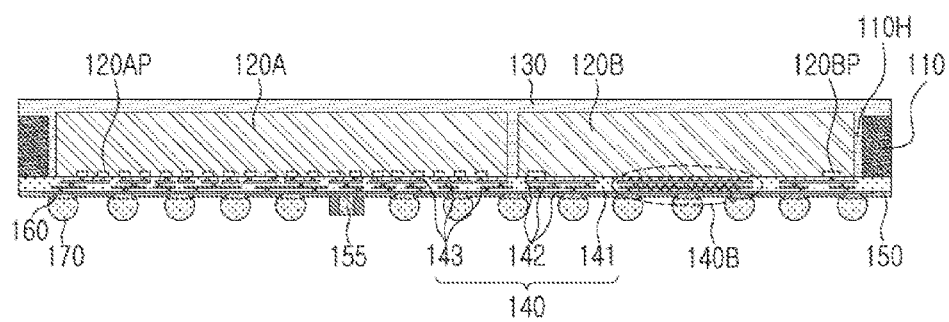

Referring to FIG. 10B, a first semiconductor package 100B may further include a core member 110 having a through hole 110H. The AP 120A and the PMIC 120B may be disposed side by side in the through hole 110H of the core member 110. The core member 110 may improve rigidity of the first semiconductor package 100B depending on certain materials, and may serve to secure uniformity of a thickness of an encapsulant 130. Side surfaces of the AP 120A and the PMIC 120B may be surrounded by the core member 110. However, such a form is only an example and may be variously modified to have other forms, and the core member 110 may perform another function depending on such a form.

A material of the core member 110 is not particularly limited. For example, an insulating material may be used as the material of the core member 110. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, ABF, FR-4, BT, or the like. Alternatively, a PID resin may also be used as the insulating material. Other configurations overlap those described above, and a detailed description thereof is thus omitted.

Figure 10C:
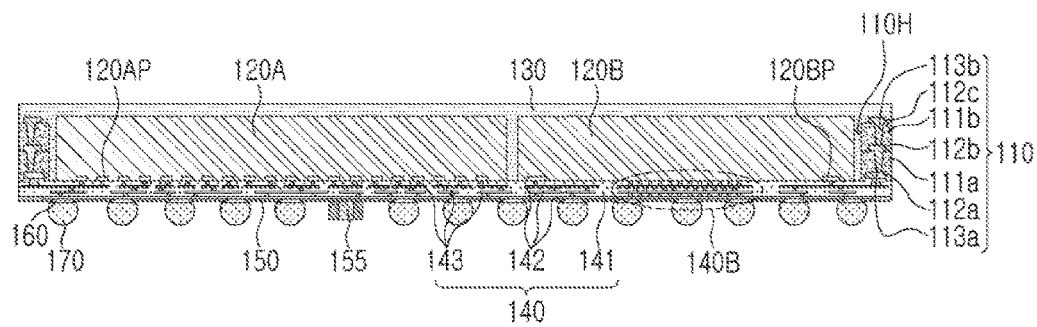

Referring to FIG. 10C, in a first semiconductor package 100C, a core member 110 may include a first insulating layer 111a in contact with a connection member 140, a first wiring layer 112a in contact with the connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 120AP and 120BP at least through the redistribution layer 142 of the connection member 140. The first and second wiring layers 112a and 112b and the second and third wiring layers 112b and 112c may be electrically connected to each other through first and second vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the connection member 140 may thus become constant. That is, a difference between a distance from a redistribution layer 142 of the connection member 140 to a lower surface of the first insulating layer 111a and a distance from the redistribution layer 142 of the connection member 140 to the connection pads 120AP and 120BP of an AP 120A and a PMIC 120B may be smaller than a thickness of the first wiring layer 112a. Therefore, a high density wiring design of the connection member 140 may be easy.

A lower surface of the first wiring layer 112a of the core member 110 may be positioned on a level above lower surfaces of the connection pads 120AP and 120BP of the AP 120A and the PMIC 120B. In addition, a distance between the redistribution layer 142 of the connection member 140 and the first wiring layer 112a of the core member 110 may be greater than those between the redistribution layer 142 of the connection member 140 and the connection pads 120AP and 120BP of the AP 120A and the PMIC 120B. Here, the first wiring layer 112a may be recessed into the first insulating layer 111a. As described above, when the first wiring layer 112a is recessed into the first insulating layer 111a, such that the lower surface of the first insulating layer 111a and the lower surface of the first wiring layer 112a have a step therebetween, a phenomenon in which a material of the encapsulant 130 bleeds to pollute the first wiring layer 112a may be prevented. The second wiring layer 112b of the core member 110 may be positioned on a level between active surfaces and inactive surfaces of the AP 120A and the PMIC 120B. The core member 110 may be formed to have a thickness corresponding to that of the AP 120A and the PMIC 120B. Therefore, the second wiring layer 112b formed in the core member 110 may be disposed on the level between the active surfaces and the inactive surfaces of the AP 120A and the PMIC 120B.

Thicknesses of the wiring layers 112a, 112b, and 112c of the core member 110 may be greater than those of the redistribution layers 142 of the connection member 140. Since the core member 110 may have a thickness equal to or greater than that of the AP 120A and the PMIC 120B, the wiring layers 112a, 112b, and 112c may be formed to be relatively large, depending on a scale of the core member 110. On the other hand, the redistribution layers 142 of the connection member 140 may be formed at sizes relatively smaller than those of the wiring layers 112a, 112b, and 112c for thinness.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 120AP and 120BP of the AP 120A and the PMIC 120B. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection structure pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have all of the shapes known in the related art, such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c. Other configurations overlap those described above, and a detailed description thereof is thus omitted.

Figure 10D:
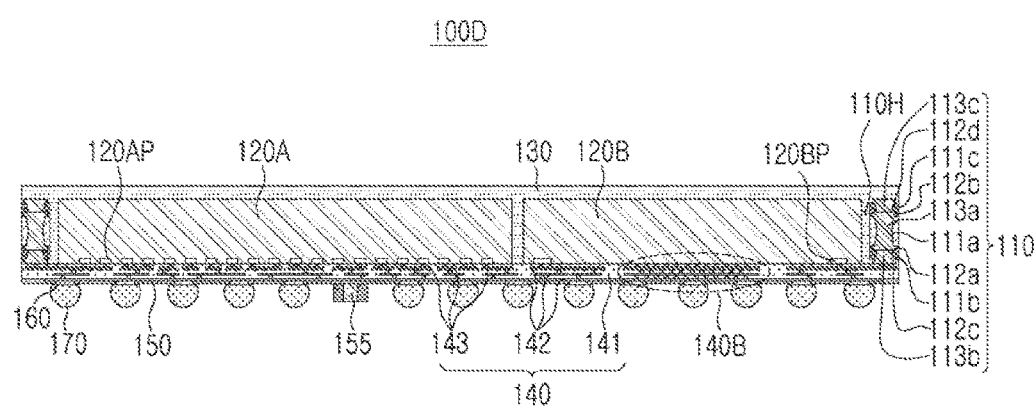

Referring to FIG. 10D, in a first semiconductor package 100D, a core member 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 120AP and 120BP at least through a redistribution layer 142 of a connection member 140. Since the core member 110 may include a large number of wiring layers 112a, 112b, 112c, and 112d, a connection member 140 may further be simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c penetrating through the second insulating layer 111b and the third insulating layer 111c, respectively.

A lower surface of the third wiring layer 112c of the core member 110 may be positioned on a level above lower surfaces of the connection pads 120AP and 120BP of an AP 120A and a PMIC 120B. In addition, a distance between a redistribution layer 142 of the connection member 140 and the third wiring layer 112c of the core member 110 may be smaller than those between the redistribution layer 142 of the connection member 140 and the connection pads 120AP and 120BP of the AP 120A and the PMIC 120B. Here, the third wiring layer 112c may be disposed on the second insulating layer 111b in protruding form, while a thin passivation layer may further be formed on the connection pads 120AP and 120BP of the AP 120A and the PMIC 120B. The first wiring layer 112a and the second wiring layer 112b of the core member 110 may be positioned on a level between active surfaces and inactive surfaces of the AP 120A and the PMIC 120B. The core member 110 may be formed to have a thickness corresponding to that of the AP 120A and the PMIC 120B. Therefore, the first wiring layer 112a and the second wiring layer 112b formed in the core member 110 may be disposed on the level between the active surfaces and the inactive surfaces of the AP 120A and the PMIC 120B.

Thicknesses of the wiring layers 112a, 112b, 112c, and 112d of the core member 110 may be greater than those of the redistribution layers 142 of the connection member 140. Since the core member 110 may have a thickness equal to or greater than that of the AP 120A and the PMIC 120B, the wiring layers 112a, 112b, 112c, and 112d may be formed to be relatively large. On the other hand, the redistribution layers 142 of the connection member 140 may be formed at relatively small sizes for thinness. Other configurations overlap those described above, and a detailed description thereof is thus omitted.

FIGS. 11A through 11F are schematic cross-sectional views illustrating various examples of a second semiconductor package of the connection system of semiconductor packages of FIG. 9.

Figure 11A:
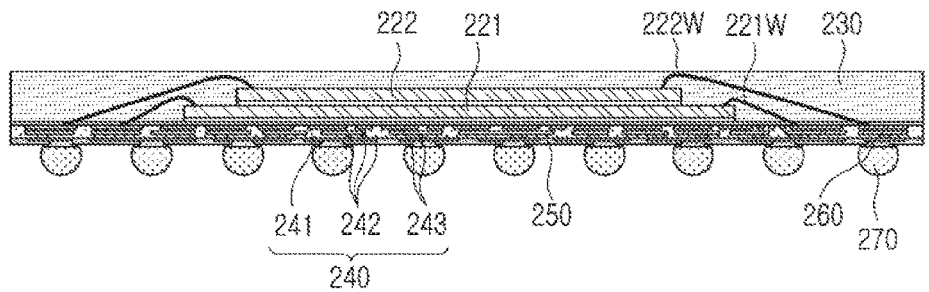
FIGS. 11A through 11F are schematic cross-sectional views illustrating various examples of a second semiconductor package of the connection system of semiconductor packages of FIG. 9.

Referring to FIG. 11A, in a second semiconductor package 200A, a plurality of memories 221 and 222 may be stacked on a connection member 240 and be encapsulated with an encapsulant 230. That is, the second semiconductor package 200A may include the connection member 240 including redistribution layers 242, a first memory 221 disposed on the connection member 240 and electrically connected to the redistribution layer 242 through bonding wires 221W, a second memory 222 disposed on the first memory 221 and electrically connected to the redistribution layer 242 through bonding wires 222W, the encapsulant 230 encapsulating at least portions of each of the first memory 221 and the second memory 222, a passivation layer 250 disposed on the connection member 240, an underbump metal layer 260 formed in openings of the passivation layer 250 and electrically connected to the redistribution layer 242, and electrical connection structures 270 electrically connected to the redistribution layer 242 through the underbump metal layer 260. The connection member 240 may be manufactured in an interposer form, but is not limited thereto. Other configurations overlap those described above, and a detailed description thereof is thus omitted.

Figure 11B:
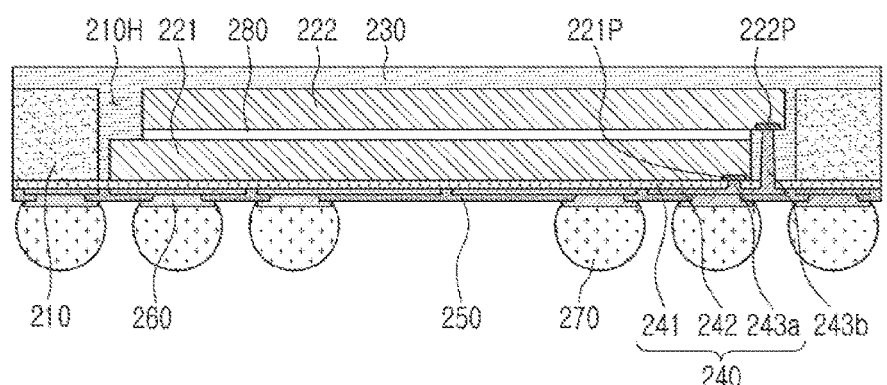

Referring to FIG. 11B, a second semiconductor package 200B may include a core member 210 having a through hole 210H, a first memory 221 disposed in the through hole 210H and having an active surface having first connection pads 221P disposed thereon and an inactive surface opposing the active surface, a second memory 222 disposed on the first memory 221 in the though-hole 210H and having an active surface having second connection pads 222P disposed thereon and an inactive surface opposing the active surface, an encapsulant 230 encapsulating at least portions of the core member 210 and the first and second memories 221 and 222, and a connection member 240 disposed on the core member 210 and the active surfaces of the first and second memories 221 and 222. The second semiconductor package 200B may further include a passivation layer 250 disposed on the connection member 240, an underbump metal layer 260 formed in openings of the passivation layer 250 and electrically connected to a redistribution layer 242 of the connection member 240, and electrical connection structures 270 electrically connected to the redistribution layer 242 of the connection member 240 through the underbump metal layer 260.

The connection member 240 may include the redistribution layer 242 electrically connected to the first connection pads 221P and the second connection pads 222P. The active surface of the second memory 222 may be attached to the inactive surface of the first memory 221, and the second memory 222 may be disposed on the first memory 221 to be offset from the first memory 221 so that the second connection pads 222P are exposed. A phrase 'disposed to be offset' means that side surfaces of the first memory 221 and side surfaces of the second memory 222 do not coincide with each other to allow the connection pads 222P of the second memory 222 disposed on the first memory 221 to be exposed by the first memory 221. The redistribution layer 242 of the connection member 240 may be connected to the first connection pads 221P and the second connection pads 222P through first vias 243a and second vias 243b, respectively. The second vias 243b may be higher than the first vias 243a.

Meanwhile, recently, technology of stacking a plurality of memory chips in multiple stages in order to increase a capacity of a memory has been developed. For example, there may be technology of stacking a plurality of memory chips in two stages (or three stages), mounting the stacked memory chips on an interposer substrate, and then molding the stacked memory chips mounted on the interposer substrate using a molding material to be thus used in a package form. In this case, the stacked memory chips are electrically connected to the interposer substrate by bonding wires. However, in this structure, there is a limitation in thinness due to a significant thickness of the interposer substrate. In addition, when the interposer substrate is manufactured on the basis of silicon, a significant cost is required. In addition, when a reinforcing material holding the stacked memory chips is not separately included, a problem may occur in reliability due to warpage. In addition, since the stacked memory chips are electrically connected to the interposer substrate through the bonding wires, such that inputs/outputs (I/Os) are redistributed, signal paths are significantly long, such that signal loss may be frequently generated.

On the other hand, in the second semiconductor package 200B according to another exemplary embodiment in the present disclosure, the core member 210 may be introduced, and a plurality of stacked memories 221 and 222 may be disposed in the through hole 210H of the core member 210. In addition, the connection member 240 including the redistribution layers 242 may be formed instead of the interposer substrate being introduced. Particularly, the plurality of stacked memories 221 and 222 may be connected to the redistribution layer 242 of the connection member 240 through multistage vias 243a and 243b having different heights rather than bonding wires. Therefore, a thickness of the connection member 240 may be significantly reduced, and a backside encapsulation thickness or a thickness of a stacked chip may also be significantly reduced. In addition, signal paths from the stacked memories 221 and 222 to the electrical connection structures 270 may be significantly reduced to reduce signal loss, resulting in improvements in signal electrical characteristics. In addition, warpage may be controlled through the core member 210, and reliability may thus be improved.

The stacked first and second memories 221 and 222 may be disposed in the through hole 210H of the core member 210. The core member 210 may improve rigidity of the second semiconductor package 200B depending on certain materials, and may serve to secure uniformity of a thickness of an encapsulant 230. Side surfaces of the stacked first and second memories 221 and 222 may be surrounded by the connection member 210. However, such a form is only an example and may be variously modified to have other forms, and the core member 210 may perform another function depending on such a form.

A material of the core member 210 is not particularly limited. For example, an insulating material may be used as the material of the core member 210. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The memories 221 and 222 may be an integrated circuit (IC) provided in an amount of several hundreds to several million or more elements integrated in a single chip. The IC may be a memory such as a volatile memory (such as a DRAM), a non-volatile memory (such as a ROM), a flash memory, or the like, but is not limited thereto. The active surfaces of the memories 221 and 222 refer to surfaces of the memories 221 and 222 on which the connection pads 221P and 222P are disposed, and the inactive surfaces thereof refer to surfaces thereof opposing the active surfaces. The memories 221 and 222 may be formed on the basis of an active wafer. In this case, a base material of a body of each of the memories 221 and 222 may be silicon (Si), germanium (Ge), gallium arsenide (GaAs), or the like. Various circuits may be formed on the body. The connection pads 221P and 222P may electrically connect the memories 221 and 222 to other components. A material of each of the connection pads 221P and 222P may be a conductive material such as aluminum (Al), or the like. A passivation layer exposing the connection pads 221P and 222P may be formed on each of the bodies, if necessary, and may be an oxide film, a nitride film, or the like, or a double layer of an oxide layer and a nitride layer. An insulating layer, and the like, may also be further disposed in required positions.

The memories 221 and 222 may be connected to the redistribution layer 242 of the connection member 240 through the vias 243a and 243b having different heights. In this case, the first vias 243a may not penetrate through the encapsulant 230, while the second vias 243b may penetrate through the encapsulant 230. That is, the first vias 243a may not be in contact with the encapsulant 230, while the second vias 243b may be in contact with the encapsulant 230. The active surface of the second memory 222 may include a first side portion facing the inactive surface of the first memory 221, a central portion facing the inactive surface of the first memory 221, and a second side portion symmetrical to the first side portion in relation to the central portion of the active surface of the second memory 222 and being at least partially out of the inactive surface of the first memory 221. In this case, the second connection pads 222P may be disposed on the second side portion of the active surface of the second memory 222. That is, the memories 221 and 222 may be disposed to be offset from each other in a step form, and the second connection pads 222P may be disposed on the second side portion of the active surface of the second memory 222, such that the multistage vias 243a and 243b having the different heights may be applied.

The memories 221 and 222 may be attached to each other through an adhesive member 280. The adhesive member 280 is not particularly limited, but may be a material that may attach the memories 221 and 222 to each other, such as the known tape, adhesive, or the like. In some case, the adhesive member 280 may also be omitted. Meanwhile, a disposition of the memories 221 and 222 is not limited to a form illustrated in the drawing. That is, the memories 221 and 222 may also be disposed in a form different from that illustrated in the plan view as long as they may be disposed to be offset from each other and the multistage vias 243a and 243b may be applied.

The encapsulant 230 may protect the memories 221 and 222. An encapsulation form of the encapsulant 230 is not particularly limited, and may be a form in which the encapsulant 230 surrounds at least portions of the memories 221 and 222. For example, the encapsulant 230 may cover the inactive surfaces and side surfaces of the memories 221 and 222, and cover at least portions of the active surfaces of the memories 221 and 222. In addition, the encapsulant 230 may cover the core member 210, and fill at least portions of the through hole 210H. The encapsulant 230 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. In addition, the known molding material such as an epoxy molding compound (EMC), or the like, may also be used. Alternatively, a PID resin on which a photolithography process may be performed may also be used as the insulating material. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material, in order to control warpage or maintain rigidity.

The connection member 240 may redistribute the connection pads 221P and 222P of the memories 221 and 222. In addition, the connection member 140 may electrically connect the connection pads 221P and 222P to each other. Several tens to several hundreds of connection pads 221P and 222P having various functions may be redistributed by the connection member 240, and may be physically or electrically externally connected through the electrical connection structures 270 depending on the functions. The connection member 240 may include insulating layers 241, the redistribution layers 242 disposed on the insulating layers 241, and the vias 243a and 243b penetrating through the insulating layers 241 and connected to the redistribution layers 242. The connection member 240 may be formed of a single layer, or may be formed of a plurality of layers of which the number is greater than that illustrated in the drawing.

A material of each of the insulating layers 241 may be an insulating material. In this case, a photosensitive insulating material such as a PID resin may also be used as the insulating material. That is, the insulating layer 241 may be a photosensitive insulating layer. When the insulating layer 241 has photosensitive properties, the insulating layer 241 may be formed to have a smaller thickness, and a fine pitch of the vias 243a and 243b may be achieved more easily. The insulating layer 241 may be a photosensitive insulating layer including an insulating resin and an inorganic filler. When the insulating layers 241 have multiple layers, materials of the insulating layers 241 may be the same as each other, and may also be different from each other, if necessary. When the insulating layers 241 are the multiple layers, the insulating layers 241 may be integrated with each other depending on a process, such that a boundary therebetween may also not be apparent.

The redistribution layers 242 may serve to substantially redistribute the connection pads 221P and 222P, and may electrically connect the connection pads 221P and 222P to each other. A material of each of the redistribution layers 242 may be a conductive material such as copper (Cu), aluminum (Al), silver (Ag), tin (Sn), gold (Au), nickel (Ni), lead (Pb), titanium (Ti), or alloys thereof. The redistribution layers 242 may perform various functions depending on designs of their corresponding layers. For example, the redistribution layers 242 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 242 may include via pads, electrical connection structures pads, and the like.

The vias 243a and 243b may electrically connect the redistribution layers 242 and 142b, the connection pads 221P and 222P, or the like, formed on different layers to each other, resulting in an electrical path in the second semiconductor package 200B. A material of each of the vias 243a and 243b may be a conductive material such as copper (Cu), aluminum (Al), silver (Ag), tin (Sn), gold (Au), nickel (Ni), lead (Pb), titanium (Ti), or alloys thereof. Each of the vias 243a and 243b may be completely filled with the conductive material, or the conductive material may also be formed along a wall of each of the vias. In addition, each of the 243a and 243b may have all of the shapes known in the related art, such as a tapered shape, a cylindrical shape, and the like.

The passivation layer 250 may protect the connection member 240 from external physical or chemical damage. The passivation layer 250 may have the openings exposing at least portions of the redistribution layer 242 of the connection member 240. The number of openings formed in the passivation layer 250 may be several tens to several thousands. The passivation layer 250 may include an insulating resin and an inorganic filler, but may not include a glass fiber. For example, the passivation layer 250 may be formed of ABF, but is not limited thereto.

The underbump metal layer 260 may improve connection reliability of the electrical connection structures 270 to improve board level reliability of the second semiconductor package 200B. The underbump metal layer 260 may be connected to the redistribution layer 242 of the connection member 240 exposed through the openings of the passivation layer 250. The underbump metal layer 260 may be formed in the openings of the passivation layer 250 by the known metallization method using the known conductive material such as a metal, but is not limited thereto.

The electrical connection structures 270 may be additionally configured to physically or electrically externally connect the second semiconductor package 200B. For example, the first semiconductor package 200B may be mounted on the printed circuit board 300 through the electrical connection structures 270. Each of the electrical connection structures 270 may be formed of a conductive material, for example, a solder, or the like. However, this is only an example, and a material of each of the electrical connection structures 270 is not limited thereto. Each of the electrical connection structures 270 may be a land, a ball, a pin, or the like. The electrical connection structures 270 may be formed as a multilayer or single layer structure. When the electrical connection structures 270 are formed as a multilayer structure, the electrical connection structures 270 may include a copper (Cu) pillar and a solder. When the electrical connection structures 270 are formed as a single layer structure, the electrical connection structures 270 may include a tin-silver solder or copper (Cu). However, this is only an example, and the electrical connection structures 270 are not limited thereto.

The number, an interval, a disposition form, and the like, of electrical connection structures 270 are not particularly limited, but may be sufficiently modified depending on design particulars by those skilled in the art. For example, the electrical connection structures 270 may be provided in an amount of several tens to several thousands according to the number of connection pads 221P and 222P, or may be provided in an amount of several tens to several thousands or more or several tens to several thousands or less.

At least one of the electrical connection structures 270 may be disposed in a fan-out region. The fan-out region is a region except for the region in which the memories 221 and 222 are disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness. Other configurations overlap those described above, and thus, a detailed description thereof is omitted.

Figure 11C:
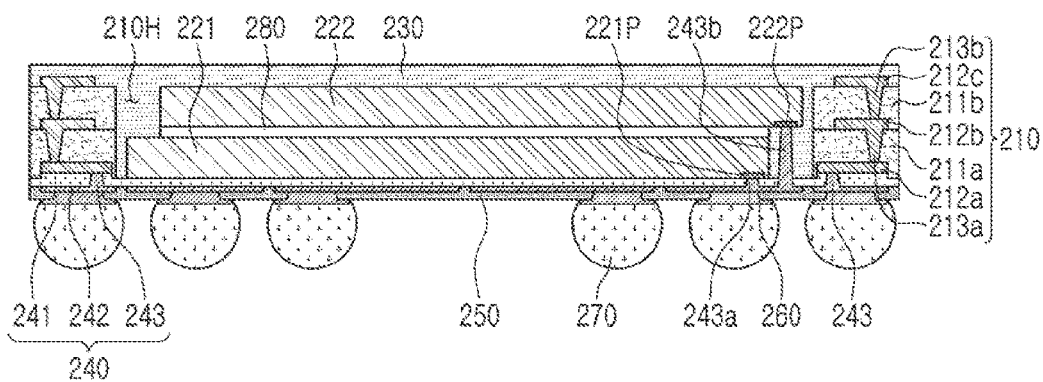

Referring to FIG. 11C, in a second semiconductor package 200C, a core member 210 may include a first insulating layer 211a in contact with a connection member 240, a first wiring layer 212a in contact with the connection member 240 and embedded in the first insulating layer 211a, a second wiring layer 212b disposed on the other surface of the first insulating layer 211a opposing one surface of the first insulating layer 211a in which the first wiring layer 212a is embedded, a second insulating layer 211b disposed on the first insulating layer 211a and covering the second wiring layer 212b, and a third wiring layer 212c disposed on the second insulating layer 211b. The first to third wiring layers 212a, 212b, and 212c may be electrically connected to connection pads 221P and 222P at least through a redistribution layer 242 of a connection member 240. The first and second wiring layers 212a and 212b and the second and third wiring layers 212b and 212c may be electrically connected to each other through first and second vias 213a and 213b penetrating through the first and second insulating layers 211a and 211b, respectively.

When the first wiring layer 212a is embedded in the first insulating layer 211a, a step generated due to a thickness of the first wiring layer 212a may be significantly reduced, and an insulating distance of the connection member 240 may thus become constant. That is, a difference between a distance from a redistribution layer 242 of the connection member 240 to a lower surface of the first insulating layer 211a and a distance from the redistribution layer 242 of the connection member 240 to the connection pad 221P of a memory 221 may be smaller than a thickness of the first wiring layer 212a. Therefore, a high density wiring design of the connection member 240 may be easy.

A lower surface of the first wiring layer 212a of the core member 210 may be disposed on a level above lower surfaces of the connection pads 221P and 222P of the memories 221 and 222. In addition, a distance between the redistribution layer 242 of the connection member 240 and the first wiring layer 212a of the core member 210 may be greater than that between the redistribution layer 242 of the connection member 240 and the connection pad 221P of the memory 221. Here, the first wiring layer 212a may be recessed into the first insulating layer 211a. As described above, when the first wiring layer 212a is recessed into the first insulating layer 211a, such that the lower surface of the first insulating layer 211a and the lower surface of the first wiring layer 212a have a step therebetween, a phenomenon in which a material of the encapsulant 230 bleeds to pollute the first wiring layer 212a may be prevented.

Thicknesses of the wiring layers 212a, 212b, and 212c of the core member 210 may be greater than those of the redistribution layers 242 of the connection member 240. Since the core member 210 may have a thickness equal to or greater than that of the memories 221 and 222, the wiring layers 212a, 212b, and 212c may be formed to be relatively large, depending on a scale of the core member 210. On the other hand, the redistribution layers 242 of the connection member 240 may be formed at sizes relatively smaller than those of the wiring layers 212a, 212b, and 212c for thinness.

A material of each of the insulating layers 211a and 211b is not particularly limited. For example, an insulating material may be used as the material of each of the insulating layers 211a and 211b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 212a, 212b, and 212c may serve to redistribute connection pads 221P and 222P of the memories 221 and 222. A material of each of the wiring layers 212a, 212b, and 212c may be a conductive material such as copper (Cu), aluminum (Al), silver (Ag), tin (Sn), gold (Au), nickel (Ni), lead (Pb), titanium (Ti), or alloys thereof. The wiring layers 212a, 212b, and 212c may perform various functions depending on designs of their corresponding layers. For example, the wiring layers 212a, 212b, and 212c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 212a, 212b, and 212c may include via pads, wire pads, electrical connection structure pads, and the like.

The vias 213a and 213b may electrically connect the wiring layers 212a, 212b, and 212c formed on different layers to each other, resulting in an electrical path in the core member 210. A material of each of the vias 213a and 213b may be a conductive material. Each of the vias 213a and 213b may be completely filled with the conductive material, or the conductive material may also be formed along a wall of each of via holes. In addition, each of the vias 213a and 213b may have all of the shapes known in the related art, such as a tapered shape, a cylindrical shape, and the like. When holes for the first vias 213a are formed, some of the pads of the first wiring layer 212a may serve as a stopper, and it may thus be advantageous in a process that each of the first vias 213a has the tapered shape of which a width of an upper surface is greater than that of a lower surface. In this case, the first vias 213a may be integrated with pad patterns of the second wiring layer 212b. In addition, when holes for the second vias 213b are formed, some of the pads of the second wiring layer 212b may serve as a stopper, and it may thus be advantageous in a process that each of the second vias 213b has the tapered shape of which a width of an upper surface is greater than that of a lower surface. In this case, the second vias 213b may be integrated with pad patterns of the third wiring layer 212c. Other configurations overlap those described above, and a detailed description thereof is thus omitted.

Figure 11D:
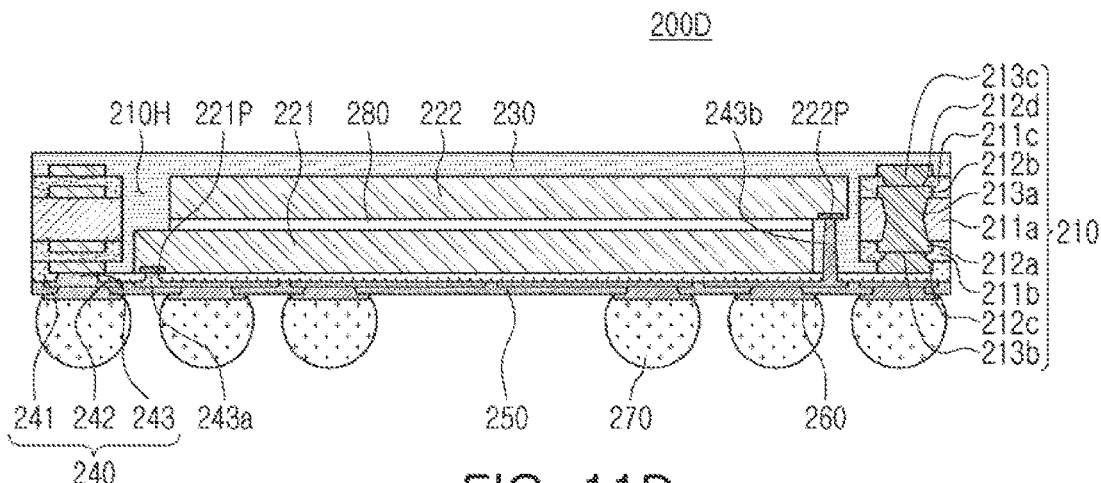

Referring to FIG. 11D, in a second semiconductor package 200D, a core member 210 may include a first insulating layer 211a, a first wiring layer 212a and a second wiring layer 212b disposed on opposite surfaces of the first insulating layer 211a, respectively, a second insulating layer 211b disposed on the first insulating layer 211a and covering the first wiring layer 212a, a third wiring layer 212c disposed on the second insulating layer 211b, a third insulating layer 211c disposed on the first insulating layer 211a and covering the second wiring layer 212b, and a fourth wiring layer 212d disposed on the third insulating layer 211c. The first to fourth wiring layers 212a, 212b, 212c, and 212d may be electrically connected to connection pads 221P and 222P at least through a redistribution layer 242 of a connection member 240. Since the core member 210 may include a large number of wiring layers 212a, 212b, 212c, and 212d, a connection member 240 may further be simplified. Therefore, a decrease in a yield depending on a defect occurring in a process of forming the connection member 240 may be suppressed. Meanwhile, the first to fourth wiring layers 212a, 212b, 212c, and 212d may be electrically connected to each other through first to third vias 213a, 213b, and 213c penetrating through the first to third insulating layers 211a, 211b, and 211c, respectively.

The first insulating layer 211a may have a thickness greater than those of the second insulating layer 211b and the third insulating layer 211c. The first insulating layer 211a may be basically relatively thick in order to maintain rigidity, and the second insulating layer 211b and the third insulating layer 211c may be introduced in order to form a larger number of wiring layers 212c and 212d. The first insulating layer 211a may include an insulating material different from those of the second insulating layer 211b and the third insulating layer 211c. For example, the first insulating layer 211a may be, for example, prepreg including a core material, a filler, and an insulating resin, and the second insulating layer 211b and the third insulating layer 211c may be an ABF or a PID film including a filler and an insulating resin. However, the materials of the first insulating layer 211a and the second and third insulating layers 211b and 211c are not limited thereto. Similarly, the first vias 213a penetrating through the first insulating layer 211a may have a diameter greater than those of second vias 213b and third vias 213c penetrating through the second insulating layer 211b and the third insulating layer 211c, respectively.

A lower surface of the third wiring layer 212c of the core member 210 may be disposed on a level below a lower surface of the connection pad 221P of a memory 222. In addition, a distance between a redistribution layer 242 of the connection member 240 and the third wiring layer 212c of the core member 210 may be greater than those between the redistribution layer 242 of the connection member 240 and the connection pads 221P and 222P of the memories 221 and 222. Here, the third wiring layer 212c may be disposed in a protruding form on the second insulating layer 211b, while a thin passivation layer may further be formed on the connection pads 221P of the memory 221.

Thicknesses of the wiring layers 212a, 212b, 212c, and 212d of the core member 210 may be greater than those of the redistribution layers 242 of the connection member 240. Since the core member 210 may have a thickness equal to or greater than that of the memories 221 and 222, the wiring layers 212a, 212b, 212c, and 212d may be formed to be relatively large. On the other hand, the redistribution layers 242 of the connection member 240 may be formed to have relatively low thinnesses. Other configurations overlap those described above, and detailed descriptions thereof are thus omitted.

Figure 11E:
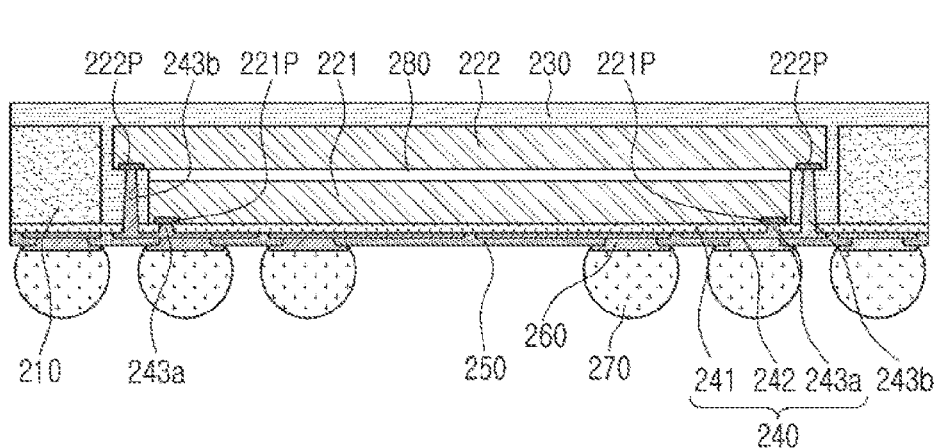

Referring to FIG. 11E, in a second semiconductor package 200E, a horizontal cross-sectional area of a second memory 222 may be greater than that of a first memory 221, unlike the second semiconductor package 200B illustrated in FIG. 11B. That is, an active surface of the second memory 222 may be wider than an inactive surface of the first memory 221. In this case, the active surface of the second memory 222 may include a first side portion being at least partially out of the inactive surface of the first memory 221, a central portion facing the inactive surface of the first memory 221, and a second side portion symmetrical to the first side portion in relation to the central portion and being at least partially out of the inactive surface of the first memory 221, and second connection pads 222P may be disposed on both of the first and second side portions of the active surface of the second memory 222. That is, the memories 221 and 222 may be disposed to be offset from each other in a form in which they have different horizontal cross-sectional areas, and the second connection pads 222P may be disposed on the first and second side portions of the active surface of the second memory 222, such that multistage vias 243A and 243B may be applied. Other configurations overlap those described above, and a detailed description thereof is thus omitted. Meanwhile, the core member 210 illustrated in FIGS. 11C and 11D may also be used in the second semiconductor package 200E.

Figure 11F:
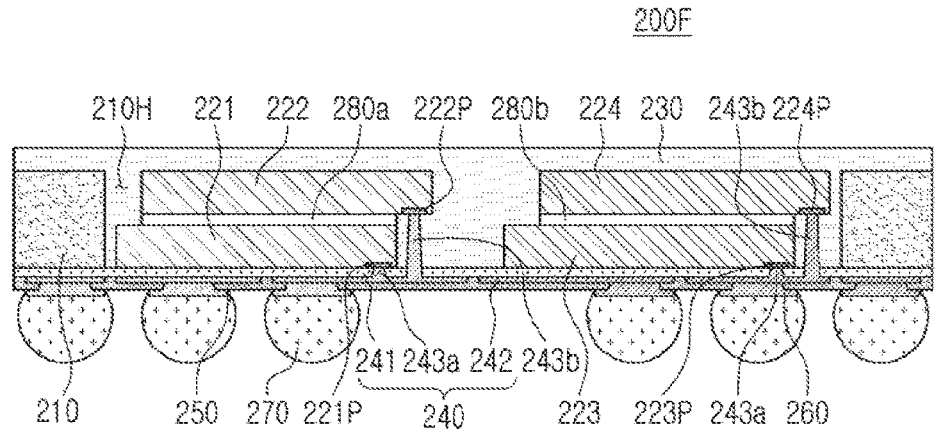

Referring to FIG. 11F, a second semiconductor package 200F may further include a third memory 223 disposed side by side with a first memory 221 in a through hole 210H and having an active surface having third connection pads 223P disposed thereon and an inactive surface opposing the active surface and a fourth memory 224 disposed on the third memory 223 in the through hole 210H and having an active surface having fourth connection pads 224P disposed thereon and an inactive surface opposing the active surface, unlike the second semiconductor package 200B illustrated in FIG. 11B. The active surface of the fourth memory 224 may be attached to the inactive surface of the third memory 223, and the fourth memory 224 may be disposed on the third memory 223 to be offset from the third memory 223 in a kind of step form so that the fourth connection pads 224P are exposed. A redistribution layer 242 of a connection member 240 may be connected to the third connection pads 223P and the fourth connection pads 224P through first vias 243a and second vias 243b, respectively. Even in a structure in which the memories 221, 222, 223, and 224 are connected to each other in a two-stage parallel structure, multistage vias 243a and 243b may be applied. The first and second memories 221 and 222 and the third and fourth memories 223 and 224 may be connected to each other through first and second adhesive members 280a and 280b, respectively. Other configurations overlap those described above, and a detailed description thereof is thus omitted. Meanwhile, the core member 210 illustrated in FIGS. 11C and 11D may also be used in the second semiconductor package 200F.

Figure 12A:
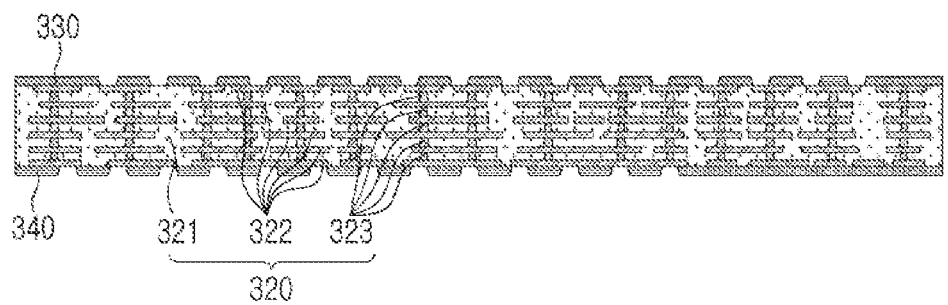
FIGS. 12A and 12B are schematic cross-sectional views illustrating various examples of a printed circuit board of the connection system of semiconductor packages of FIG. 9.
Figure 12B:
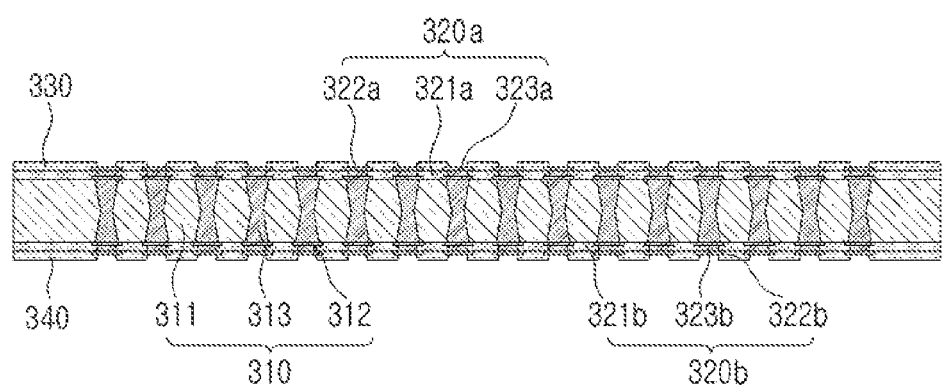

FIGS. 12A and 12B are schematic cross-sectional views illustrating various examples of a printed circuit board of the connection system of semiconductor packages of FIG. 9.

Referring to FIG. 12A, a printed circuit board 300A may have a form of a coreless substrate 320 having passivation layers 330 and 340 formed, respectively, on opposite surfaces thereof. In more detail, the printed circuit board 300A may have a form in which in which the passivation layers 330 and 340 are formed, respectively, on opposite surfaces of the coreless substrate 320 including an insulating layer 321 formed by stacking a plurality of build-up layers, a plurality of circuit layers 322 formed on the respective build-up layers, and a plurality of via layers 323 penetrating through the respective build-up layers to connect the circuit layers 322 to each other. A material of each of the build-up layers of the insulating layer 321 may be the known insulating material such as epoxy, polyimide, or the like, together with an inorganic filler, and a material of each of the circuit layers 322 and the via layers 323 may be the known conductive material such as copper (Cu), or the like. A material of each of the passivation layers 330 and 340 may be a solder resist, or the like. However, the materials of the build-up layers, the circuit layers 322 and the via layers 323, and the passivation layers 330 and 340 are not limited thereto. Various components may be embedded in the printed circuit board 300A, if necessary.

Referring to FIG. 12B, a printed circuit board 300B may have a form of a core substrate in which build-up members 320a and 320b are disposed on opposite surfaces of a core member 310, respectively, and passivation layers 330 and 340 are disposed on the build-up members 320a and 320b, respectively. The core member 310 may include a core layer 311, circuit layers 312 formed on opposite surfaces of the core layer 311, respectively, and through-wirings 313 penetrating through the core layer 311. The respective build-up members 320a and 320b may include build-up layers 321a and 321b, circuit layers 322a and 322b each formed on the build-up layers 322a and 322b, and via layers 323a and 323b penetrating through the build-up layers 321a and 321b, respectively, respectively. A larger number of layers may also be formed. The core layer 311 may be introduced through a copper clad laminate (CCL), or the like, and may be formed of prepreg, or the like, but is not limited thereto. Other configurations overlap those described above, and a detailed description thereof is thus omitted.

Figure 13:
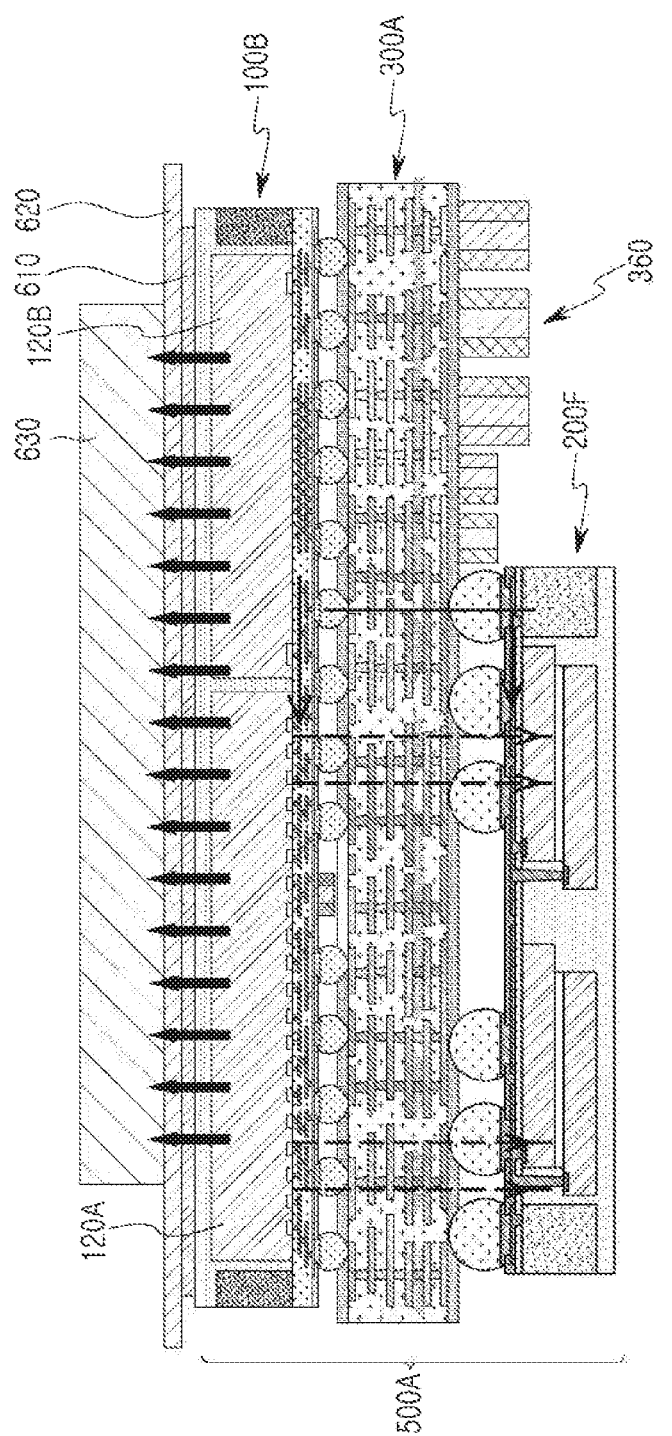
FIG. 13 is a schematic cross-sectional view illustrating several effects of the connection system of semiconductor packages in accordance with a layout of the present disclosure.

FIG. 13 is a schematic cross-sectional view illustrating several effects of the connection system of semiconductor packages in accordance with a layout of the present disclosure.

Referring to the drawing, in a connection system 500A of semiconductor packages according to an exemplary embodiment in the present disclosure, the memory 220 of the second semiconductor package 200F described above is disposed directly below the AP 120A of the first semiconductor package 100B described above in relation to the printed circuit board 300A, and transfer paths of signals S may thus be significantly reduced, and the AP 120A and the PMIC 120B of the first semiconductor package 100B described above are packaged side by side in one package 100B, and transfer paths of power P may thus be optimized. For example, the power P may be transferred from the PMIC 120B to the AP120A through a path in a connection member of the first semiconductor package 100B rather than a path also through the printed circuit board 300A, so as to reduce a power transfer path from the PMIC 120B to the AP 120A, thereby reducing power used in power transfer. In addition, a shield can 620 may be attached to the first semiconductor package 100B including the AP 120A and the PMIC 120B generating a large amount of heat, using the known resin layer 610, and a heat sink 630 such as a metal block or a heat pipe 630 may be disposed on the shield can 620 to simultaneously dissipate effectively the heat of the AP 120A and the PMIC 120B generating the large amount of heat. In addition, passive components 360, together with the second semiconductor package 200F, may be disposed on the same surface of the printed circuit board 300A.

Figure 14:
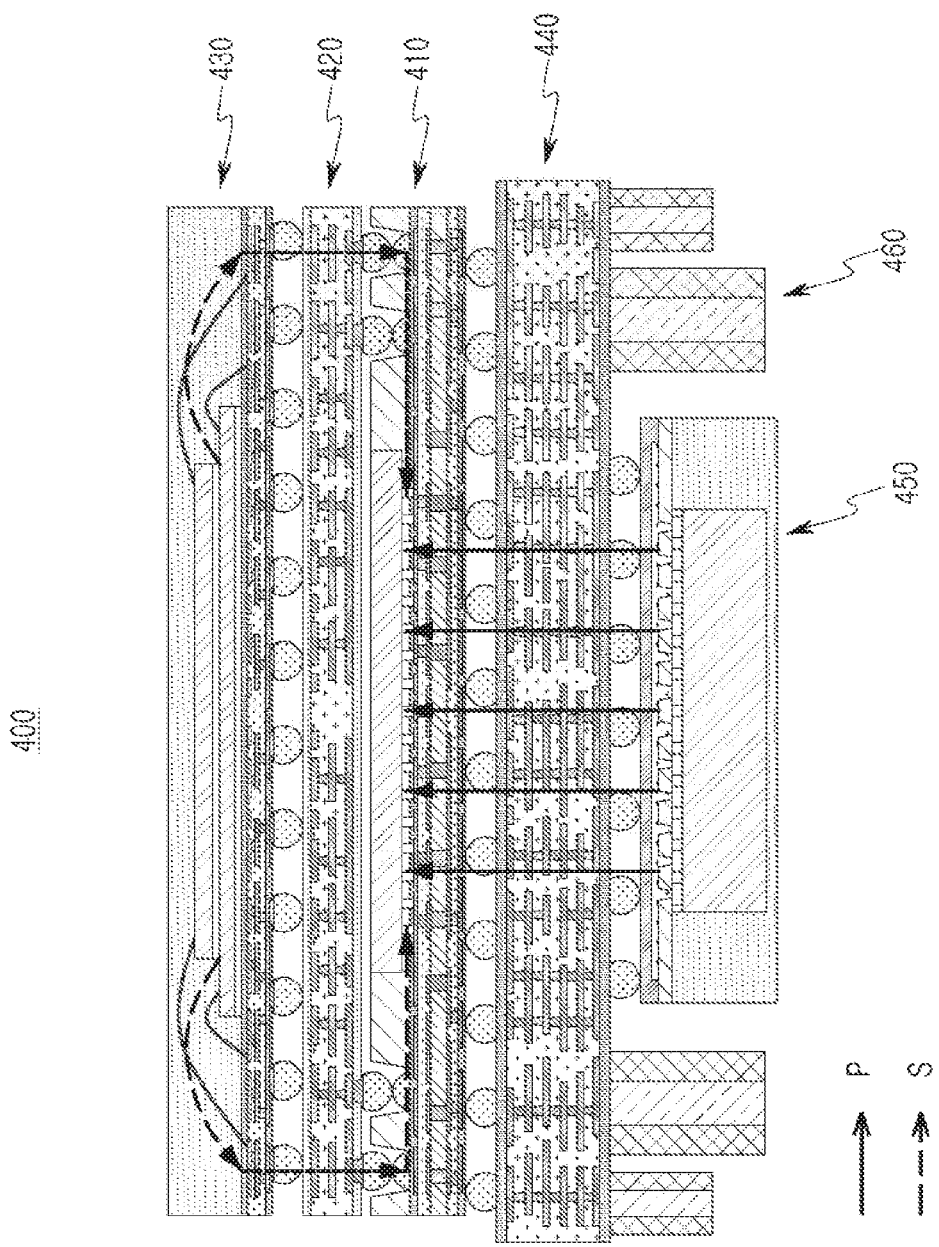
FIG. 14 is a schematic cross-sectional view illustrating a relative problem of a connection system of semiconductor packages that is not in accordance with a layout of the present disclosure.

FIG. 14 is a schematic cross-sectional view illustrating a relative problem of a connection system of semiconductor packages that is not in accordance with a layout of the present disclosure.

Referring to the drawings, in a connection system 400 of semiconductor packages that is not in accordance with the present disclosure, a memory package 430 may be disposed on an AP package 410 in a POP form with an interposer 420 interposed therebetween, and such a POP structure may be disposed on one surface of a printed circuit board 440. In addition, a PMIC package 450 and passive components 460 may be disposed on the other surface of the printed circuit board 440. In such a structure, an AP and a PMIC are distant from each other, such that a complicated structure for heat dissipation is required and transfer paths of signals S and power P are increased.

As set forth above, according to the exemplary embodiments in the present disclosure, a connection system of semiconductor packages in which an AP and a memory may be connected to each other through a short path without using a separate interposer or backside redistribution layer and a PMIC may be disposed at an optimal design may be provided.

While exemplary embodiments have been shown and described above, it will be apparent to those skilled in the art that modifications and variations could be made without departing from the scope of the present invention as defined by the appended claims.

What is claimed is:

1. A connection system of semiconductor packages, comprising:
a printed circuit board having a first surface, and a second surface, opposing the first surface;
a first semiconductor package disposed on the first surface of the printed circuit board and connected to the printed circuit board through first electrical connection structures; and
a second semiconductor package disposed on the second surface of the printed circuit board and connected to the printed circuit board through second electrical connection structures,
wherein the first semiconductor package includes an application processor (AP) and a power management integrated circuit (PMIC) disposed side by side,
the second semiconductor package includes a memory,
the first semiconductor package includes the AP and the PMIC disposed side by side and having active surfaces having connection pads disposed thereon and inactive surfaces opposing the active surfaces, respectively, an encapsulant encapsulating at least portions of each of the AP and the PMIC, a connection member disposed on the active surface of the AP and the active surface of the PMIC and including a redistribution layer electrically connecting the respective connection pads of the AP and the PMIC to each other, and the first electrical connection structures disposed on the other surface of the connection member opposing one surface of the connection member on which the AP and the PMIC are disposed and electrically connecting the redistribution layer to the printed circuit board.

2. The connection system of semiconductor packages of claim 1, wherein the first semiconductor package and the second semiconductor package are disposed to face each other with the printed circuit board interposed therebetween.

3. The connection system of semiconductor packages of claim 1, wherein the AP and the memory are disposed to face each other with the printed circuit board interposed therebetween.

4. The connection system of semiconductor packages of claim 1, wherein the first semiconductor package further includes a core member having a through hole, and
the AP and the PMIC are disposed side by side in the through hole.

5. The connection system of semiconductor packages of claim 4, wherein the core member includes a first insulating layer in contact with the connection member, a first wiring layer in contact with the connection member and embedded in the first insulating layer, and a second wiring layer disposed on the other surface of the first insulating layer opposing one surface of the first insulating layer in which the first wiring layer is embedded, and
the first and second wiring layers are electrically connected to the respective connection pads of the AP and the PMIC.

6. The connection system of semiconductor packages of claim 5, wherein the core member further includes a second insulating layer disposed on the first insulating layer and covering the second wiring layer and a third wiring layer disposed on the second insulating layer, and
the third wiring layer is electrically connected to the respective connection pads of the AP and the PMIC.

7. The connection system of semiconductor packages of claim 4, wherein the core member includes a first insulating layer and a first wiring layer and a second wiring layer disposed on opposite surfaces of the first insulating layer, respectively, and
the first and second wiring layers are electrically connected to the respective connection pads of the AP and the PMIC.

8. The connection system of semiconductor packages of claim 7, wherein the core member further includes a second insulating layer disposed on the first insulating layer and covering the first wiring layer, a third wiring layer disposed on the second insulating layer, a third insulating layer disposed on the first insulating layer and covering the second wiring layer, and a fourth wiring layer disposed on the third insulating layer, and
the third and fourth wiring layers are electrically connected to the respective connection pads of the AP and the PMIC.

9. The connection system of semiconductor packages of claim 1, wherein the connection member of the first semiconductor package comprises a heat dissipation member.

10. The connection system of semiconductor packages of claim 1, wherein the first semiconductor package comprises a passive component disposed on the other surface of the connection member opposing the one surface of the connection member on which the AP and the PMIC are disposed.

11. The connection system of semiconductor packages of claim 1, wherein power is transferred from the PMIC to the AP through the connection member of the first semiconductor package and not through the printed circuit board, and is transferred from the PMIC to the memory at least through the printed circuit board.

12. The connection system of semiconductor packages of claim 1, further comprising a plurality of passive components disposed on the second surface of the printed circuit board.

13. The connection system of semiconductor packages of claim 1, further comprising a heat sink covering the AP and the PMIC.

14. A connection system of semiconductor packages, comprising:
a printed circuit board having a first surface, and a second surface, opposing the first surface;
a first semiconductor package disposed on the first surface of the printed circuit board and connected to the printed circuit board through first electrical connection structures; and
a second semiconductor package disposed on the second surface of the printed circuit board and connected to the printed circuit board through second electrical connection structures,
wherein the first semiconductor package includes an application processor (AP) and a power management integrated circuit (PMIC) disposed side by side,
the second semiconductor package includes a memory, and
the second semiconductor package includes a connection member including a redistribution layer, a first memory disposed on the connection member and electrically connected to the redistribution layer, a second memory disposed on the first memory and electrically connected to the redistribution layer, an encapsulant encapsulating at least portions of the first memory and the second memory, and the second electrical connection structures disposed on the other surface of the connection member opposing one surface of the connection member on which the first and second memories are disposed and electrically connecting the redistribution layer to the printed circuit board.

15. The connection system of semiconductor packages of claim 14, wherein the first and second memories are connected to the redistribution layer by bonding wires, respectively.

16. The connection system of semiconductor packages of claim 14, wherein the first and second memories are connected to the redistribution layer through vias.

17. The connection system of semiconductor packages of claim 14, wherein the second semiconductor package further includes a core member having a through hole, and
the first and second memories are disposed in the through hole.

18. The connection system of semiconductor packages of claim 17, wherein the core member includes a first insulating layer in contact with the connection member, a first wiring layer in contact with the connection member and embedded in the first insulating layer, and a second wiring layer disposed on the other surface of the first insulating layer opposing one surface of the first insulating layer in which the first wiring layer is embedded, and
the first and second wiring layers are electrically connected to the first and second memories.

19. The connection system of semiconductor packages of claim 18, wherein the core member further includes a second insulating layer disposed on the first insulating layer and covering the second wiring layer and a third wiring layer disposed on the second insulating layer, and
the third wiring layer is electrically connected to the first and second memories.

20. The connection system of semiconductor packages of claim 17, wherein the core member includes a first insulating layer and a first wiring layer and a second wiring layer disposed on opposite surfaces of the first insulating layer, respectively, and
the first and second wiring layers are electrically connected to the first and second memories.

21. The connection system of semiconductor packages of claim 20, wherein the core member further includes a second insulating layer disposed on the first insulating layer and covering the first wiring layer, a third wiring layer disposed on the second insulating layer, a third insulating layer disposed on the first insulating layer and covering the second wiring layer, and a fourth wiring layer disposed on the third insulating layer, and
the third and fourth wiring layers are electrically connected to the first and second memories.

22. A connection system of semiconductor packages, comprising:
a printed circuit board having a first surface, and a second surface, opposing the first surface;
a first semiconductor package disposed on the first surface of the printed circuit board, and including a first connection member, and a first semiconductor chip and a power management integrated circuit (PMIC) disposed side by side along the first surface; and
a second semiconductor package disposed on the second surface of the printed circuit board and including a second semiconductor chip,
wherein pads of the first semiconductor chip and the PMIC and pads of the second semiconductor chip face the printed circuit board,
the pads of the PMIC and the first semiconductor chip are electrically connected to each other at least through a redistribution layer of the first connection member,
the pads of the PMIC and the second semiconductor chip are electrically connected to each other at least through the printed circuit board,
the first semiconductor package includes a first encapsulant encapsulating at least portions of each of the first semiconductor chip and the PMIC, and first electrical connection structures electrically connecting the redistribution layer of the first connection member to the printed circuit board, and
the first encapsulant is spaced apart from the printed circuit board.

23. The connection system of semiconductor packages of claim 22, wherein the second semiconductor chip overlaps with the first semiconductor chip and the PMIC in a direction along which the second semiconductor package, the printed circuit board, and the first semiconductor package are stacked.

24. A connection system of semiconductor packages, comprising:
a printed circuit board having a first surface, and a second surface, opposing the first surface;
a first semiconductor package disposed on the first surface of the printed circuit board, and including a first connection member, and a first semiconductor chip and a power management integrated circuit (PMIC) disposed side by side along the first surface; and
a second semiconductor package disposed on the second surface of the printed circuit board and including a second semiconductor chip,
wherein pads of the first semiconductor chip and the PMIC and pads of the second semiconductor chip face the printed circuit board,
the pads of the PMIC and the first semiconductor chip are electrically connected to each other at least through a redistribution layer of the first connection member,
the pads of the PMIC and the second semiconductor chip are electrically connected to each other at least through the printed circuit board,
the second semiconductor package includes a second connection member having a redistribution layer electrically connected to the pads of the second semiconductor chip, a second encapsulant encapsulating at least a portion of the second semiconductor chip, and second electrical connection structures electrically connecting the redistribution layer of the second connection member to the printed circuit board, and
the second encapsulant is spaced apart from the printed circuit board.

25. The connection system of semiconductor packages of claim 24, wherein the second semiconductor chip overlaps with the first semiconductor chip and the PMIC in a direction along which the second semiconductor package, the printed circuit board, and the first semiconductor package are stacked.

* * * * *